United States Patent [19]

Chang et al.

[11] Patent Number: 5,225,711
[45] Date of Patent: Jul. 6, 1993

[54] PALLADIUM ENHANCED SOLDERING AND BONDING OF SEMICONDUCTOR DEVICE CONTACTS

[75] Inventors: Chin-An Chang, Peekskill; Nicholas G. Koopman, Hopewell Junction; Judith M. Roldan, Ossining, all of N.Y.; Steven Strickman, Reading, Pa.; Kamalesh K. Srivastava, Wappingers Falls; Helen L. Yeh, Katonah, both of N.Y.

[73] Assignee: International Business Machines Corporation, Armonk, N.Y.

[21] Appl. No.: 667,489

[22] Filed: Mar. 11, 1991

Related U.S. Application Data

[60] Division of Ser. No. 522,473, May 14, 1990, Pat. No. 5,048,744, which is a continuation of Ser. No. 289,174, Dec. 23, 1988, abandoned.

[51] Int. Cl.$^5$ ............ H01L 23/48; H01L 29/44; H01L 29/52; H01L 29/60
[52] U.S. Cl. ................. 257/750; 257/762; 257/768; 228/123; 228/180.2; 228/215; 228/220
[58] Field of Search ............ 357/71, 65, 66, 67; 228/123, 180.2, 215, 220, 208; 257/750, 762, 768, 772

[56] References Cited

U.S. PATENT DOCUMENTS

| Re. 32,086 | 2/1986 | Spirig | 228/19 |
|---|---|---|---|
| 2,818,522 | 12/1957 | Wheeler | 313/268 |
| 3,368,274 | 2/1968 | Brunet | 29/589 |
| 3,380,812 | 4/1968 | Kamashita et al. | 357/65 |
| 3,413,711 | 12/1968 | Brewer et al. | 29/473.1 |
| 3,686,539 | 8/1972 | Schwarzman | 357/71 |
| 3,715,797 | 2/1973 | Jackson et al. | 29/426 |
| 3,719,981 | 3/1973 | Steitz | 29/423 |
| 3,726,464 | 4/1973 | Howell et al. | 228/19 |
| 3,839,727 | 10/1974 | Herdzik et al. | 357/71 |
| 3,862,488 | 1/1975 | Pessell et al. | 29/492 |
| 4,016,050 | 4/1977 | Lesh et al. | 357/71 |
| 4,023,725 | 5/1977 | Ivett et al. | 228/123 |
| 4,032,058 | 6/1977 | Riseman | 228/180 A |
| 4,109,297 | 8/1978 | Lesh et al. | 357/71 |
| 4,176,443 | 12/1979 | Iannuzzi et al. | 29/589 |
| 4,379,218 | 4/1983 | Grebe et al. | 219/121 ED |
| 4,463,059 | 7/1984 | Bhattacharya et al. | 428/620 |
| 4,465,223 | 8/1984 | Cammarano et al. | 228/198 |
| 4,500,611 | 2/1985 | Nickol et al. | 428/686 |
| 4,603,805 | 8/1986 | Rogers | 228/123 |
| 4,610,934 | 9/1986 | Boecker et al. | 428/627 |
| 4,645,116 | 2/1987 | Henein et al. | 228/123 |
| 4,646,958 | 3/1987 | Howard, Jr. | 228/123 |
| 4,875,617 | 6/1989 | Citowsky | 357/71 |
| 5,048,744 | 9/1991 | Chang et al. | 228/123 |

FOREIGN PATENT DOCUMENTS

DE3306154 8/1984 Fed. Rep. of Germany.

OTHER PUBLICATIONS

Circuits Manufacturing, Oct. 1984, p. 40, "Fluxless SMD Soldering" by Hendriks et al.
IBM Technical Disclosure Bulletin, vol. 23, No. 11, Apr. 1981, p. 4915, "Ion Milling Technique to Reflow Solder Pads" by Herdzik et al.
SU-965656 Micro-Strip Device Low Temp. Flux-Free Soldering-With Preliminary Coating of Surfaces to Be Soldered with Metals or Alloys of Melting Point Close to That of Solder.
IBM Technical Disclosure Bulletin, vol. 21, No. 4, Sep. 1978, p. 1688, "Solder Ball C4 Joints for Multireflow" by Brusic et al.
"Studies of Hydrogen Spillover" by Bond and Tripathi, Faraday Transactions I, vol. 72, p. 933.

(List continued on next page.)

Primary Examiner—Rolf Hille
Assistant Examiner—David Ostrowski
Attorney, Agent, or Firm—Daniel P. Morris; Alvin J. Riddles

[57] ABSTRACT

The fluxless bonding in a reducing atmosphere of integrated circuit contacts containing copper is enhanced using a layer of 200 to 1500 Angstrom thick palladium which inhibits copper oxide formation before fusion and reduces all oxides to promote wetting during fusion.

9 Claims, 4 Drawing Sheets

OTHER PUBLICATIONS

"Single Intermetallic Compound Formation in Pd-Pb and Pd-Sn Thin-Film Couples Studied by X-Ray Diffraction" by K. N. Tu, Materials Letters, vol. 1, p. 6, 1982, 1975.

"Immersion Tin: Its Chemistry, Metallurgy and Application in Electronic Packaging Technology" by Z. Kovac and K. N. Tu, IBM Journal of Research and Development, vol. 28, p. 726, 1984.

"A Molecular-Beam Investigation of the Reaction $H_2 + \frac{1}{2}O_2 = H_2O$ on Pd(111)" by Engel and Kuipers, Surface Science, vol. 90, p. 181.

"Thermal Dry Process Soldering" by Moskowitz et al., J. Vac. Sci. Technol. vol. 4, May/Jun. 1986.

IBM Technical Disclosure Bulletin, vol. 26, No. 1, Jun. 1983, "Method of Enhancing Infrared Absorption of Copper Dressing Blocks" by Klein, p. 237.

IBM Technical Disclosure Bulletin, vol. 24, No. 10, mar. 1982, "Used Electronic Module Pin Solder Dress Process" by Lamoureux et al., p. 5170.

IBM Technical Disclosure Bulletin, vol. 21 No. 12 p. 4804, May 1979 "Cermet Solder Dam".

Electronic Engineering, vol. 48, No. 583 pp. 63, 65, 67 Sep. 1976 "Metal Bumps Aid . . . Circuit Procedures".

Chemical Abstracts vol. 106, No. 14, Apr. 6, 1987, Withlaw et al., "Improving the Solderability of Metallized Printed Circuits".

Chemical Abstracts vol. 97, No. 8, Aug. 23, 1982, Hitachi Ltd. "Bump Electrode".

PALLADIUM ENHANCED SOLDERING AND BONDING OF SEMICONDUCTOR DEVICE CONTACTS

This application is a divisional application of application Ser. No. 07/522,473 filed May 14, 1990, now U.S. Pat. No. 5,048,744, issued Sep. 17, 1991; which application Ser. No. 07/522,473 is in turn a continuation of application Ser. No. 07/289,174 filed Dec. 23, 1988, now abandoned.

DESCRIPTION

1. Technical Field

The invention relates to the solder joining of semiconductor device contacts without the use of flux for repeated joining or bonding at low temperature.

2. Background of the Invention

In semiconductor integrated circuit contact technology, the art has developed to a level where contacts of small diameter pads with fine pitch are being employed in interconnecting the high density integrated circuitry which in turn is now having occasionally to be reworked so that the ever smaller connections must not only be connectable in large numbers but must also accommodate repeated separation and rejoining at a low temperature. In this technology, layers of various metals are introduced for purposes of facilitating connection, preventing diffusion, enhancing contact conductance and resisting corrosion. The manufacturing process generally is simplified if a portion of the process such as the fabrication of the semiconductor structure can be completed and then that product be able to be attached and reattached after reworking with a small temperature excursion and no degradation.

As an illustration, a typical chip and substrate contact pads combination would consist of a thin adhesive barrier metal layer which would contact a through hole metal which in turn would contact the chip or a substrate dielectric surface. The barrier metal layer is chosen to promote adhesion between the contact pad and the chip or dielectric and it also serves as a metallurgical barrier to prevent mixing, during solder joining, of the metal chosen for the through hole conductor and a thicker conductive layer in the contact. This latter contact layer is usually copper. Occasionally, the adhesive barrier metal layer is made up of two layers, one layer of a metal to promote adhesion, the other layer of a metal to act as a barrier to interaction between layers. The conductive layer is at the surface capped by a thin gold layer to retard surface corrosion. In this type of structure, a problem is encountered in that copper diffuses through a gold layer forming an oxide at the contact pad surface. Heretofore in the art, in most applications a flux has been used in the soldering.

Traditionally, in the solder field, a flux is employed to dissolve any oxide on the fusing surfaces to permit the wetting of the metals. Unfortunately, the use of flux has several drawbacks in semiconductor contact technology. The material of the flux is generally corrosive. Further, it boils at temperatures in the vicinity of the fusing temperatures of the metals and so can become a carrier for liquid metal droplets which at the sizes involved may, if they strike the sides of the chip, produce a short circuit or cause interference. Still further, voids are created in the fused metal interfaces and at interfaces with other material at the contact. The voids can contain entrapped material that should be removed and which later is detrimental if it outgasses. They can drastically affect heat removal since in small contacts they reduce the area and consequently raise the resistance. Since flux is so difficult to remove and any remnants that remain tend to produce the various disadvantages described, efforts are being directed in the art to provide a technology for semiconductor integrated circuit contacts that does not involve the use of flux.

DESCRIPTION OF THE PRIOR ART

Many efforts in the prior art development of fluxless solder bonding employed cleaning and reflowing operations in the same unbroken controlled environment. Ion milling in a vacuum followed by reflow in the same vacuum is described in IBM Technical Disclosure Bulletin Vol. 23, No. 11, April 1981, page 4915.

In U.S. Pat. No. 4,379,218, ion beam heating breaks up the oxide in the vacuum environment and then in the same vacuum the solder reflow takes place.

In Circuits Manufacturing, Oct. 1984, page 40, a fluxless soldering technique is described wherein a thick layer of a low temperature solder is caused to fuse in an environment wherein the temperature is controlled by the presence of the latent heat in a fluorocarbon type vapor.

Recently, developments in the art employ a reducing atmosphere during the reflowing operation. This is described in U.S. Pat. No. 4,646,958 and in U.S. Pat. No. 4,645,116. The chemical reduction capability of a reducing atmosphere varies widely with hydrogen concentration and temperature and at a low temperature is so relatively weak as to affect a yield of good contacts.

As the contact areas become smaller and smaller and the process window, that is the allowable temperature excursion to which the device can be subjected in the reflow without extraneous damage becomes narrower, it is becoming very difficult in the art to simultaneously satisfy all the limitations.

SUMMARY OF THE INVENTION

Figure 1:
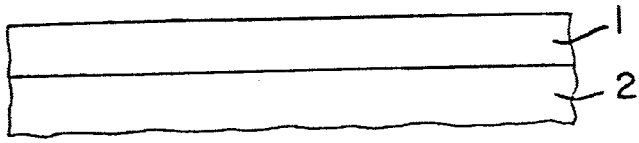
FIG. 1 is a schematic view of the two layer metallurgical cross section illustrating the invention.

It has been found in accordance with the invention that a thin, of the order of 200 to 1500 Angstroms, layer of the element palladium in solder fusion adjacent to copper operates in a reducing atmosphere to enhance the fusion at low temperature in the total absence of flux. The enhancement capability of the invention can be used in almost all fusion joining operations employing low and high temperature solders and high temperature brazing materials and is applicable in all semiconductor contact technologies including that of the use of a copper block to remove and to thereby dress-up the solder on pads when chips are to be reconnected.

The palladium layer of the invention promotes the chemical reduction of any oxides back to the element metals where the oxides are in the fusion region of either the chip or the circuit element to which it is to be attached thereby radically enhancing wetting by the fusion material and effecting joining at markedly reduced temperatures.

DETAILED DESCRIPTION OF THE INVENTION

It has been found in accordance with the invention that the element palladium in a layer 200 to 1500 Angstroms thick in a fusion operation adjacent to copper in a reducing atmosphere in the total absence of a flux will radically enhance the wetting in the fusion and effect void free fusion joining at very low, of the order of 215° to 350° C. temperatures. This is of particular value in semiconductor device and integrated circuit contacting technology wherein the items being joined are so sensitive to temperature excursions and where repeated fusions tend to consume the layers of materials that are present in the contacting area for electrical and barrier purposes.

The customary element for corrosion resistance in fluxless soldering has been gold (Au). It has been known that the elements of the platinum group of metals of which palladium is a member, that is the group of Pt, Pd, Rh, Ru and Os, will resist corrosion so that replacement of Au with a Pt group metal may be postulated.

It has been further known in the chemical catalytic reaction art that Pt group metals cause hydrogen molecules to dissociate into hydrogen atoms and that those hydrogen atoms accelerate a chemical reduction process so that the presence of a member of the Pt group may be postulated as enhancing the chemical reduction of an oxide.

In the semiconductor integrated circuit contacting art, however, metals are present for combined physical, electrical and sometimes chemical properties which produces unpredictability in process and material changes.

Further, since the contact may be made of layers of several metals and the fusion material may be an alloy of several metals, many oxides may be involved. In an example in a Pb/Sn solder CuTi contact, stannic oxide, lead oxide and copper oxide would be involved at low temperatures.

In accordance with the invention, it has been found that in the semiconductor contacting art palladium (Pd) exhibits combined properties of corrosion resistance, enhancement of chemical reduction throughout the fusion region and wettability to solder. These and possibly other properties permit the radically improved wetting on copper considered responsible for the low 215° C. to 350° C. joining ability. It has been found that platinum (Pt) does not exhibit these combined properties.

The thickness of the Pd layer is of importance. The layer must be of a minimum thickness to provide sufficient material for oxide reduction which thickness is greater than 200 Angstroms. The layer further should not be so thick as to interfere with temperature transfer and to provide material for undesirable intermetallic compound formation. The layer should not be thicker than about 1500 Angstroms. The layer is preferably applied by a deposition technique such as sputtering, evaporation or immersion plating.

Referring to FIG. 1, there is shown a schematic view of a two layer metallurgical cross section of an intermediate manufacturing product in illustration of the invention wherein a layer 1 of the element palladium (Pd) between 200 and 1500 Angstroms in thickness is in contact with a member 2 of copper (cu) or a fusion material such as solder.

The structure of FIG. 1 is an intermediate manufacturing structure in a fusion joining operation wherein the Pd layer 1, in one situation where the layer 2 is a copper layer, resists corrosion so that in the presence of a reducing atmosphere in a fusion operation the palladium layer 1 makes up for weakness in the reducing capability of the reducing atmosphere in reducing oxides present in the fusion region thereby producing a radically improved wetting of the copper at low temperature.

Figure 2:
FIG. 2 is a prior art photomicrograph of the low temperature fluxless wettability in a reducing atmosphere of solder on copper.
Figure 3:
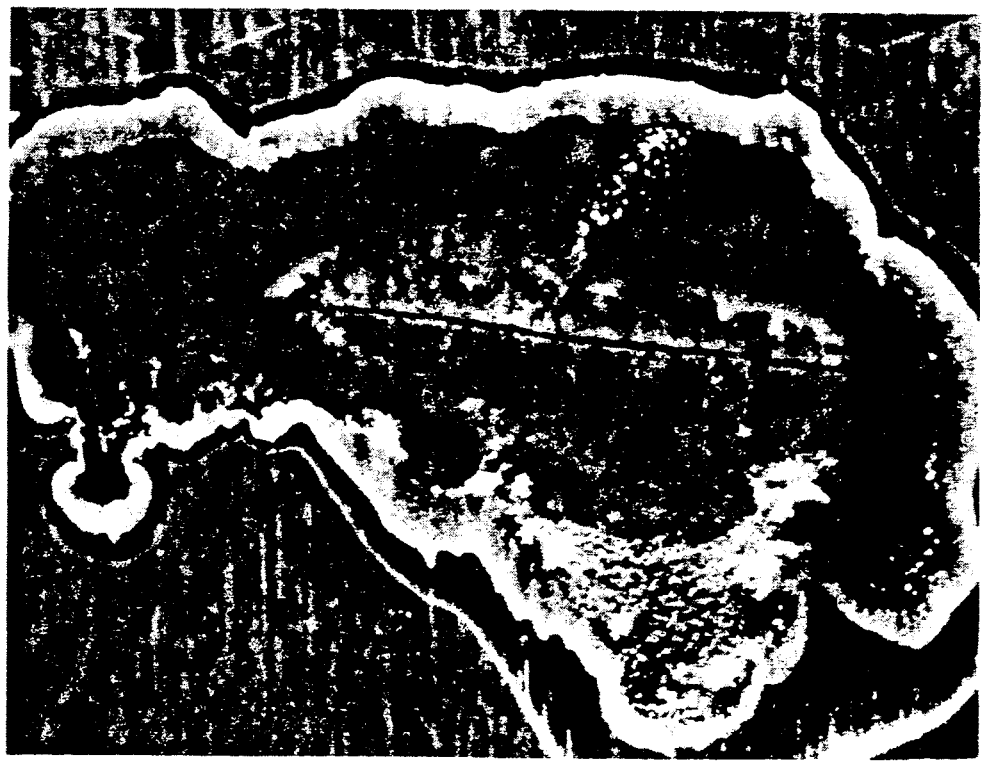
FIG. 3 illustrates the advantage in wettability of the invention in a photomicrograph of solder on copper under the same conditions as FIG. 2.

The unexpected wetting improvement of the invention may be seen in a comparison of FIGS. 2 and 3 of the same lead/tin eutectic solder on copper at 250° Centigrade temperature in a hydrogen reducing atmosphere.

In FIG. 2, which is the prior art situation, the solder on the copper does not spread or evenly wet the copper but rather wells up vertically.

In contrast, in FIG. 3, a radially improved wetting is provided. In the invention, the palladium layer during fusion reduces oxides in the fusion region.

It will be apparent in FIG. 3 that the lateral spread with the invention comes close to encompassing the entire copper support. It has been found in accordance with the invention that all solders such as low temperature solder, generally the Pb/Sn eutectic type and the relatively high temperature solders such as Pb 5 wt. % Sn type are radically enhanced in their wettability in a reducing atmosphere by the presence of the palladium layer in the required thickness. The thickness of the palladium layer 1 in FIG. 1 should be at least 200 Angstroms to provide enough material to reduce the oxides that happen to be present but the thickness should not exceed 1500 Angstroms in order to prevent intermetallic compounds that tend to form and which may reduce the quality and reproducibility of the bond.

While a full understanding of the physical mechanism is not essential to the practice of the invention, the following description of a possible physical mechanism may be of assistance in extending the principles of the invention.

It is postulated that the palladium layer absorbs hydrogen and causes the molecules thereof to dissociate into adsorbed hydrogen atoms which atoms in turn are stabilized in the surface structure, which has many peaks for the colliding hydrogen molecules to attach onto and thus serves effectively as a catalyst.

This mechanism is postulated to be consistent with the mechanism reported by Bond and Tripathi in Faraday Trans. I, Vol. 72, page 933.

The thickness of the layer limitation prevents formation of deleterious palladium compounds with the associated metals in the contact.

Further, in accordance with the invention, in most integrated circuit contacting practice on both the contact on the chip and the contact on the packaging substrate, there will be at least one layer of copper used for principally conductivity enhancement. The palladium 1 of the invention is of particular advantage in promoting wettability in the presence of this copper even though there may be other layers between the copper and the solder or bonding agent. The palladium 1 during fusion reduces oxides to the metal elements from which they were formed.

In accordance with the invention, the palladium 1 is present in a reachable surface so that it can enhance the wetting. Satisfactory performance can occur whether the palladium is covered by a thin layer of less than 30 Angstroms of oxygen or carbon, or whether the palladium is blended with the copper. Although it will be apparent that the more copper at the surface, the more oxide will have to be reduced. Further, with the exception of slight differences in thickness, whether the palladium layer 1 is applied by evaporation, sputtering or immersion plating does not seem to make significant difference.

The intermediate manufacturing structure of FIG. 1 may also occur in a situation where the layer 2 is the solder or bonding agent and the structure is to be employed in a connection to a copper layer of a contact. This type situation may be convenient in reworking or reattaching chips and the performance of the invention works in the same way as in the first situation.

The various situations are discussed in greater detail in connection with FIGS. 4 to 7.

Figure 4:
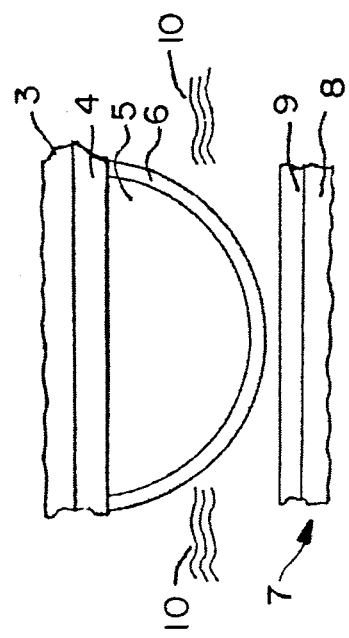
FIG. 4 is a processing illustration wherein a contact on a semiconductor chip is positioned for fusion with a pad having structural features in accordance with the invention.

Referring next to FIG. 4, a processing illustration is shown wherein a contact on a semiconductor chip is positioned for fusion with a pad or surface connection of a wiring structure. In FIG. 4, the chip 3 would have as one connection an area 4 of conductive material serving as a contact thereto. On the element 4 is fused an element 5 of fusion material such as a solder or a brazing material. In many semiconductor applications, Pb/Sn solder is employed for the element 5. On the element 5 is a layer 6 of an oxide of each of the ingredients of element 5. The element 5 and oxide surface 6 are in the shape of a mound or ball as is standard practice in the art.

In the processing illustration of FIG. 4, a pad 7 which is the surface connection for further wiring is made up of an underlying layer of copper 8 over which a layer 9 of Pd that is less than 1500 Angstroms in thickness is positioned. In the formation of the contact, the elements 5 and 6 are brought into contact at the fusion temperature with the Pd layer 9 in the presence of a chemically reducing atmosphere shown as element 10.

At a low fusion temperature, the layer 9 now performs a chemical reduction enhancement function in making up for weakness in chemical reduction capability of the reducing environment 10 thereby relaxing constraints on what reducing environmental gasses may be used, the temperatures required and the oxides reduced. The result is wetting and fusion at lower temperature and shorter dwell time above liquidus temperature.

Figure 5:
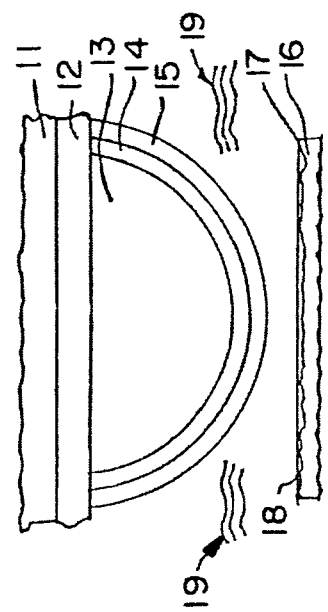
FIG. 5 is a processing illustration of a contact on a chip that is positioned for fusion in being rejoined to a pad wherein the chip contact is provided structural features in accordance with the invention.

Referring next to FIG. 5, it may, under conditions of reworking, be advantageous to modify the location of the Pd layer. In FIG. 5, which is a processing illustration of a chip contact in position for rejoining to a wiring pad, the chip is labelled element 11, the conductive material area is labelled element 12, the ball shaped fusion material is labelled element 13 and the oxide layer is labelled element 14. In this situation, the Pd layer is placed on the chip side and is labelled element 15. The pad 16 will be of copper with a residue of fusion material, usually solder and intermetallic compounds, shown as element 17 in the surface 18 thereof. The reducing atmosphere is shown as element 19.

In the reworking situation of FIG. 5, the residue solder 17 in the surface 18 would have an oxide on it. In addition to being easier to provide the Pd coating 15 on the chip contacts of rework type chips in manufacture, it is much more difficult to apply a localized Pd coating only on the pad surfaces 18 of an isolated chip location being reworked in the midst of an array.

The invention can accommodate such variations as depicted in the processing illustrations of FIGS. 4 and 5, wherein in FIG. 4 the intermediate structure of FIG. 1 will be elements 8 and 9 whereas in the situation of FIG. 5 the layers of FIG. 1 will be elements 13 to 15.

In the reworking of apparatus by removing and either reconnecting or replacing the chips therein, the removal of the residue fusion material or solder from the pad of a removed chip requires some care. All the heat excursion constraints in contact joining are present here as well. The residue solder is not flat and interferes with good contact. The sizes and spacings are such that physical abrading operations are seldom practical.

Figure 6:
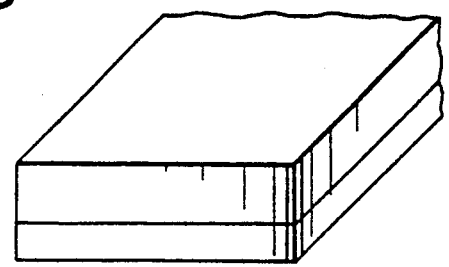
FIG. 6 is an illustration of a dressing block employing the invention used for dressing the contact pads of an integrated circuit after removal of a chip and prior to rejoining.

The structure of the invention of FIG. 1 is shown modified in FIG. 6 as a dressing block for removal of the residue solder. The block 20 is of sintered copper having on at least one surface thereof the layer of Pd of the invention labelled element 21. Such dressing blocks have been known in the art and some have layers of solder on the surface used for dressing. In accordance with the invention, the Pd layer 21 enhances the wettability of the solder and accelerates the transfer of solder residue on the pad to the block 20. The layer 21 makes it possible to eliminate the solder layer on the block 20 making the block 20 easier to manufacture and providing a longer service life.

Figure 7:
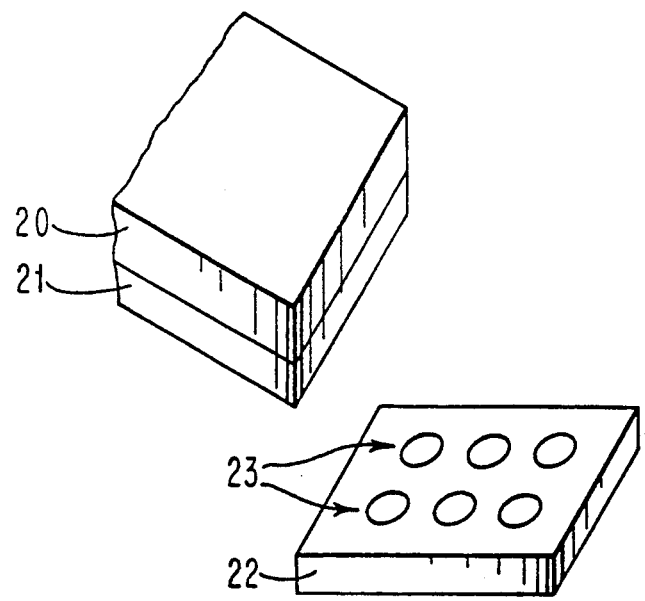
FIG. 7 is a perspective view of the use of a dressing block to prepare a pad for chip rejoining.

The pad dressing operation is illustrated in FIG. 7 which is a perspective showing the block 20 with the Pd layer 21 positioned to be drawn over the surface of element 22 having thereon a vertical relief of residue solder locations 23 produced when a chip connection fused and the chip was lifted away. The element 22 and block 21 are brought up to fusion temperature in contact with each other and in accordance with the invention, the Pd layer 21 so enhances the wettability of the block 20 that the residue solder at locations 23 transfers to the block 20 at a lower peak temperature and at a shorter holding time for that temperature. In the processing illustration of FIG. 5, the layer 21 serves the function of the layer 1 in FIG. 1 and the element 23 serves the function of the layer 2.

It will be apparent to one skilled in the art that there will be many variations within the scope of the principles of the invention. As examples of such variations, the invention provides several unique integrated circuit contact metallurgical structures. These structures are shown in FIGS. 8, 9, 10 and 11.

Figure 8:
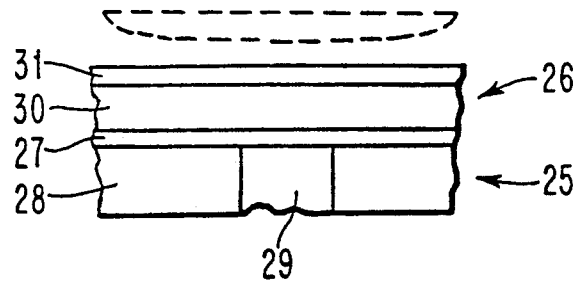
FIG. 8 is a schematic illustration of a three layer intermediate manufacturing contact product in accordance with the invention.

Referring to FIG. 8, an integrated circuit contact is illustrated that has simplicity and is particularly useful with high conductivity material connecting members or vias as the term has come to be used in the art. The contact 25 has on the top surface or external connecting portion 26 a first layer 27 of chromium. The chromium layer 27 provides conductivity with a property of adhesion to the insulating material 28 which may be a polymer such as polyimide or a ceramic oxide that surrounds the via 29 which is of high conductivity metal such as copper. The chromium 27 also provides the property of a barrier to prevent interaction of the solder of the connection, shown dotted. In the external connecting portion 26 over the layer 27 there is provided a layer 30 of copper which imparts the combined properties of being the joining member in the soldering operation and enhancing conductivity. The layer 30 may be adjusted in thickness to accommodate the partial consumption of the layer with each reflow and reconnection. At the surface of the contact, a layer 31 of palladium from 200 to 1500 Angstroms thick serves to reduce oxide and promote wetting in a soldering operation conducted without flux in the presence of a reducing atmosphere. The contact illustrated in FIG. 8 provides a flux free repeated joining capability where the contact retains the required conductivity electrical properties through the repeated joinings even if the layer 30 is totally consumed.

Figure 9:
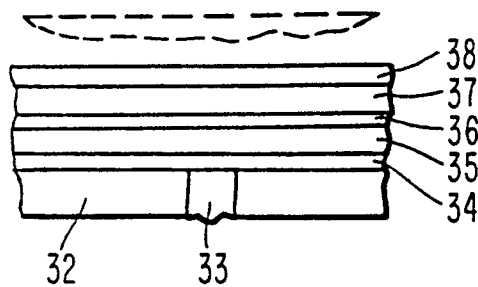
FIG. 9 is a schematic illustration of a five layer intermediate manufacturing contact product in accordance with the invention.

Referring next to FIG. 9, an integrated circuit contact is illustrated that has particular advantage in situations where the material used for the via connection is of lower conductivity or connectability. Such materials are for example molybdenum and aluminum.

In the polymer or ceramic oxide or insulating portion 32 the via 33 is of a material that cannot be relied on for good conductivity through low temperature connections. In the top surface portion of the contact over the material 32 and the via 33 a layer 34 of chromium is provided to provide adhesion to the insulating material 32 and a conductive yet barrier to interaction property between the via 33 material and a conductivity imparting layer 35 of copper. Over the copper conductivity imparting layer 35, a layer 36 of titanium is provided to prevent any solder from interacting with and reducing the electrical conductivity imparting properties of the layer 35. A copper layer 37 is provided to be the joining layer with the solder, shown dotted, as the connection is completed. A surface layer 38 of palladium between 200 and 1500 Angstroms thick completes the structure. The palladium layer 38 inhibits the oxidation of the copper layer 37 before joining, reduces all oxides and promotes wetting during fusing in a fluxless operation in a reducing atmosphere.

The contact of FIG. 9 has the advantages that the interspersed barrier layers and conductivity imparting layers retain electrical conductivity properties through repeated fusings even though the material of the via 33 cannot be relied on for good conductivity in low temperature connections and the layer 37 is totally consumed in the fusion and dressing operations of repeated joinings.

The contacts of FIGS. 8 and 9 are adaptable to the providing of a spreading control or damming member that confines the lateral travel of a material.

Figure 10:
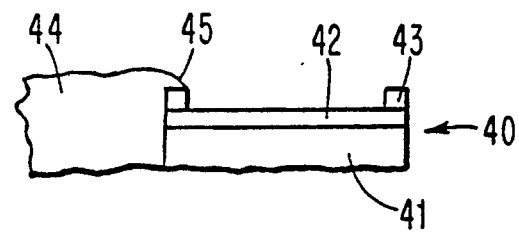
FIG. 10 is an illustration of an adhesive and surface tension interface element in the invention.
Figure 11:
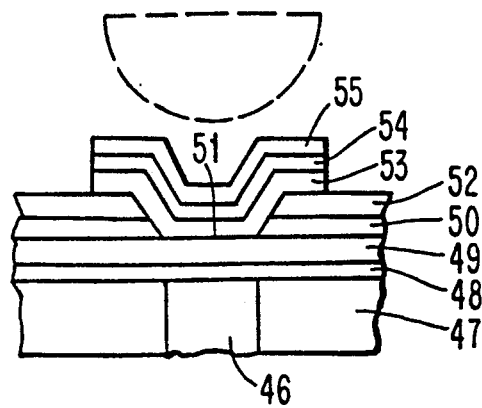
FIG. 11 is an illustration of the adhesive and surface tension interface element in the invention in a surface contact application.

The spreading control member is illustrated in FIGS. 10 and 11 on a contact surface and as a part of top surface metallurgy for other wiring and connections.

Referring to FIG. 10, the contact 40 shows only the copper layer 41 with the 200–1500 Angstrom thickness palladium layer 42 thereover at the surface. Frequently, in contact fabrication, it is desirable with close spacing and with insulating materials that flow have a means of damming or controlling lateral travel. This is achieved with the member 43 of chromium which surrounds the periphery of the contact and which stops lateral flow of solder on the surface of the layer 42, not shown, and which prevents lateral flow of a polymer type insulation 44 such as polyimide at the edge 45 of the chromium member 43.

Referring next to FIG. 11, the principle of the lateral control member is employed in construction of a top surface metallurgy type of contact. In the contact of FIG. 9, the via 46 surrounded by insulating material 47 is covered by a first adhesive and contacting layer 48 such as chromium with barrier properties to prevent interaction between the via 46 material and a conductivity imparting layer 49 such as copper. Over the layer 49 a spreading control member layer 50 such as chromium is deposited with an opening 51 generally registered over the via 46. An insulating polymer 52 that extends to areas between vias, not shown, is applied with the lateral spread stopping at an edge coinciding with the edge of the layer 50.

The top surface metallurgical connection is then deposited through a mask, not shown, that controls the lateral dimensions. A layer 53 of titanium is deposited extending into the opening 51 and contacting the layer 49. The layer 53 of a material such as titanium provides the properties of adhesion, conductive connecting and barrier to layer interaction. The principal function is to prevent solder in future repeated fusings from interacting with the layer 49. A fusion layer 54 of copper is provided over the layer 53. The copper fusion layer 54 is to fuse with solder, shown dotted, as the contact is assembled. Over the copper layer 54, a controlled 200 to 1500 Angstrom thickness layer 55 of palladium is applied which, prior to the fusion operation, inhibits oxidation of the copper 54 thereby making the relatively weak chemical reducing capability of the reducing atmosphere to be used in fusing more effective, and then, during the fusion operation when the solder, shown dotted, is brought into contact with the palladium layer 55 at the fusion temperature in the presence of a reducing atmosphere, the palladium layer 55 reduces all oxides providing thorough wetting with lower temperature and a shorter dwell time at that temperature.

BEST MODE FOR CARRYING OUT THE INVENTION

The palladium layer would be 1000 Angstroms of pure palladium applied by evaporation on a fusion layer of copper in the vicinity of 2 microns in thickness. The reducing atmosphere is forming gas containing 10% hydrogen. The temperature would be 250° C.

Where a conductivity copper layer is involved, it would be approximately 1 micron. The adhesive and barrier layers would be of chromium approximately 1000 Å thick. The spreading control layer element would be chromium approximately 1000 Å thick.

What has been described are intermediate manufacturing product structures and integrated circuit contacting processes employing the principle that a 200 to 1500

Angstrom thick layer of palladium enhances the wettability of copper and solder at low temperatures in a fluxless reducing atmosphere.

Having thus described our invention, what we claim as new and desire to secure by Letters Patent is:

1. In semiconductor integrated circuit manufacturing fluxless contact technology an intermediate manufacturing product comprising:
    a first layer member containing palladium in a thickness between 200 to 1500 Angstroms and in contact with
    a second member composed of at least one material taken from the group of partially oxidized copper and partially oxidized solder.

2. The product of claim 1 wherein said first layer member is pure palladium.

3. The product of claim 1 wherein the material of said second member is copper.

4. The product of claim 1 wherein the material of said second member is solder.

5. The product of claim 2 wherein the material of said second member is copper.

6. The product of claim 5 wherein said second member is a copper block.

7. The product of claim 2 wherein said second layer is a solder.

8. In low temperature fluxless bonding semiconductor integrated circuit manufacturing contact technology an intermediate manufacturing product comprising:
    a first layer member containing palladium in a thickness between 200 and 1500 Angstroms and in contact with,
    a second member composed of a material taken from the group of copper and solder having in contact with said palladium containing layer at least one selected from the group of oxides of copper, tin and lead.

9. The product of claim 8 wherein said second member is of copper.

* * * * *